US 012148724B2

(12) United States Patent
Oshikubo et al.

(10) Patent No.: US 12,148,724 B2
(45) Date of Patent: Nov. 19, 2024

(54) PACKAGE WITH BUILT-IN ELECTRONIC COMPONENTS AND ELECTRONIC DEVICE

(71) Applicant: FUJITSU LIMITED, Kawasaki (JP)

(72) Inventors: Yukiko Oshikubo, Atsugi (JP);
Yoshihiro Nakata, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 396 days.

(21) Appl. No.: 17/727,277

(22) Filed: Apr. 22, 2022

(65) Prior Publication Data
US 2023/0044252 A1 Feb. 9, 2023

(30) Foreign Application Priority Data

Aug. 6, 2021 (JP) ................................. 2021-129762

(51) Int. Cl.
*H01L 23/00* (2006.01)
*H01L 23/522* (2006.01)
*H01L 23/528* (2006.01)

(52) U.S. Cl.
CPC .......... *H01L 24/08* (2013.01); *H01L 23/5226* (2013.01); *H01L 23/5283* (2013.01); *H01L 24/16* (2013.01); *H01L 2224/0801* (2013.01); *H01L 2224/08056* (2013.01); *H01L 2224/08059* (2013.01); *H01L 2224/16227* (2013.01); *H01L 2224/16238* (2013.01); *H01L 2924/35121* (2013.01)

(58) Field of Classification Search
CPC . H01L 24/08; H01L 23/5226; H01L 23/5283; H01L 24/16; H01L 2224/0801; H01L 2224/08056; H01L 2224/08059; H01L 2224/16227; H01L 2224/16238; H01L 2924/35121; H01L 24/11; H01L 24/13
See application file for complete search history.

(56) References Cited

U.S. PATENT DOCUMENTS

| | | | |
|---|---|---|---|
| 9,899,308 B2* | 2/2018 | Tseng | H01L 23/49827 |
| 10,199,341 B2* | 2/2019 | Liang | H01L 23/293 |
| 11,227,846 B2* | 1/2022 | Hsu | H01L 23/3677 |
| 11,908,790 B2* | 2/2024 | Yang | H01L 21/76877 |
| 2004/0124529 A1 | 7/2004 | Hanaoka | |
| 2011/0156226 A1* | 6/2011 | Kasuya | H01L 23/3677 257/E23.08 |
| 2016/0233194 A1* | 8/2016 | Chen | H01L 25/105 |
| 2020/0411467 A1* | 12/2020 | Yang | H01L 24/81 |

FOREIGN PATENT DOCUMENTS

JP 2004-153249 A 5/2004
JP 2020-88105 A 6/2020

* cited by examiner

*Primary Examiner* — Kyoung Lee
*Assistant Examiner* — Sophia W Kao
(74) *Attorney, Agent, or Firm* — WHDA, LLP

(57) ABSTRACT

A package with built-in electronic components that is to be soldered to an electronic circuit board includes: an insulating layer; an electronic component provided on one surface of the insulating layer; and a pad which is electrically connected to the electronic component and in which a plurality of openings that extend from a first surface of the pad in contact with a solder bump to the insulating layer are formed, wherein an area of the plurality of openings at the first surface is larger than an area of the plurality of openings at a second surface of the pad, which is an opposite surface to the first surface and is in contact with the insulating layer.

7 Claims, 25 Drawing Sheets

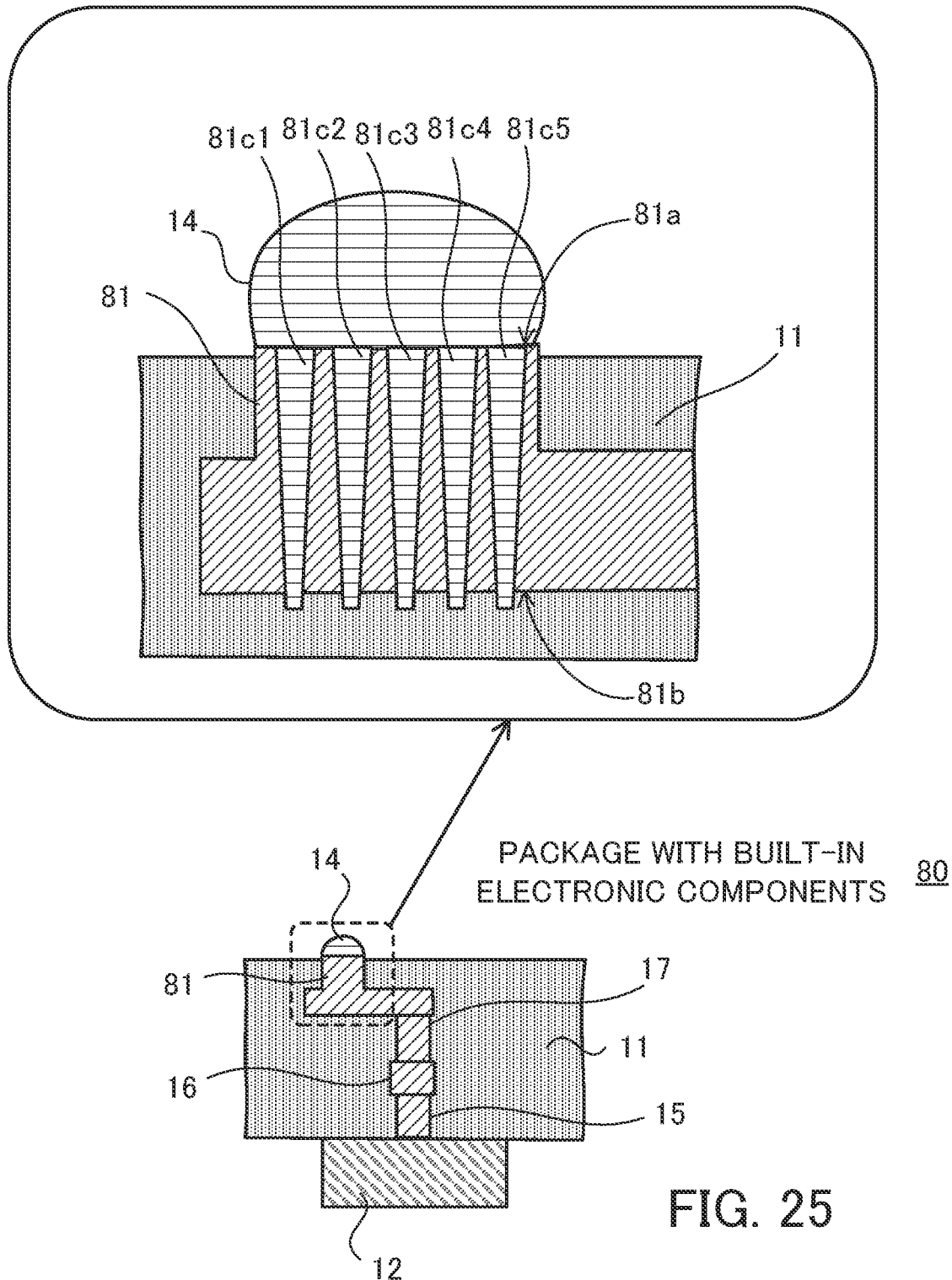

PACKAGE WITH BUILT-IN ELECTRONIC COMPONENTS AND ELECTRONIC DEVICE

CROSS-REFERENCE TO RELATED APPLICATION

This application is based upon and claims the benefit of priority of the prior Japanese Patent Application No. 2021-129762, filed on Aug. 6, 2021, the entire contents of which are incorporated herein by reference.

FIELD

The embodiments discussed herein relate to a package with built-in electronic components and an electronic device.

BACKGROUND

Known examples of packages that have built-in electronic components include chip size packages (CSPs) and fan out wafer level packages (FOWLPs), which enable electronic components to be mounted with a high density. See, for example, Japanese Laid-open Patent Publication Nos. 2004-153249 and 2020-88105.

Out of the packages mentioned above, an FOWLP has a rewiring layer formed by a build-up wiring process on a pseudo wafer that has been formed by embedding an electronic component (for example, a semiconductor chip) in mold resin, and is compatible with electronic components with large numbers of terminals.

In use, an FOWLP is soldered to a printed wiring board or the like. However, when heat is generated, such as during operation of the electronic component, stress generated by the difference in thermal expansion coefficients between the FOWLP and the printed wiring board or the like may cause breakage of a soldered joint and/or disconnections on the rewiring layer. In the past, a method has been proposed where pads that are electrically insulated from the electronic component and have through holes are provided at the four corners of an FOWLP where thermal stress tends to be concentrated, so as to produce holes in the solder bumps formed on the pads. See, for example, Japanese Laid-open Patent Publication No. 2020-88105. With this method, when the thermal stress becomes excessive, cracking occurs in the solder bumps in which the holes are formed before cracking would occur in the insulating film of the rewiring layer, which suppresses the occurrence of cracking in the insulating film.

However, with the conventional method described above, there is the risk of the pads on the FOWLP peeling off due to the heat applied when the FOWLP is soldered to a printed wiring board or the like. This has resulted in pad attachment not being sufficiently reliable. This problem may occur not only for an FOWLP but also for other packages with built-in electronic components, such as a CSP.

SUMMARY

According to an aspect, there is provided a package with built-in electronic components that is to be soldered to an electronic circuit board, including: an insulating layer; an electronic component provided on one surface of the insulating layer; and a pad which is electrically connected to the electronic component and in which a plurality of openings that extend from a first surface of the pad in contact with a solder bump to the insulating layer are formed, wherein an area of the plurality of openings at a second surface of the pad, which is an opposite surface to the first surface and is in contact with the insulating layer, is smaller than an area of the plurality of openings at the first surface.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 25 is a cross-sectional view depicting a second modification of a package with built-in electronic components.

DESCRIPTION OF EMBODIMENTS

The present inventors discovered that the peeling of pads on an FOWLP is caused by main components and contaminants of the insulating layer formed on an FOWLP being gasified by the heat applied during soldering of the FOWLP to a printed wiring board and the resulting gas applying pressure to the pads. That is, the inventors found that the peeling of pads was also caused by a factor aside from the thermal stress generated by differences in thermal expansion between the FOWLP and the printed circuit board.

The present embodiments described below were conceived to prevent pads from peeling and improve the reliability of pad attachment by efficiently venting gases that are generated from the insulating layer during soldering. The embodiments described below are not limited to FOWLP but may also be applied to other packages with built-in electronic components, such as CSP, where there is the risk of gases being generated as described above, and the same effects are achievable.

Several embodiments will be described below with reference to the accompanying drawings.

First Embodiment

Figure 1:
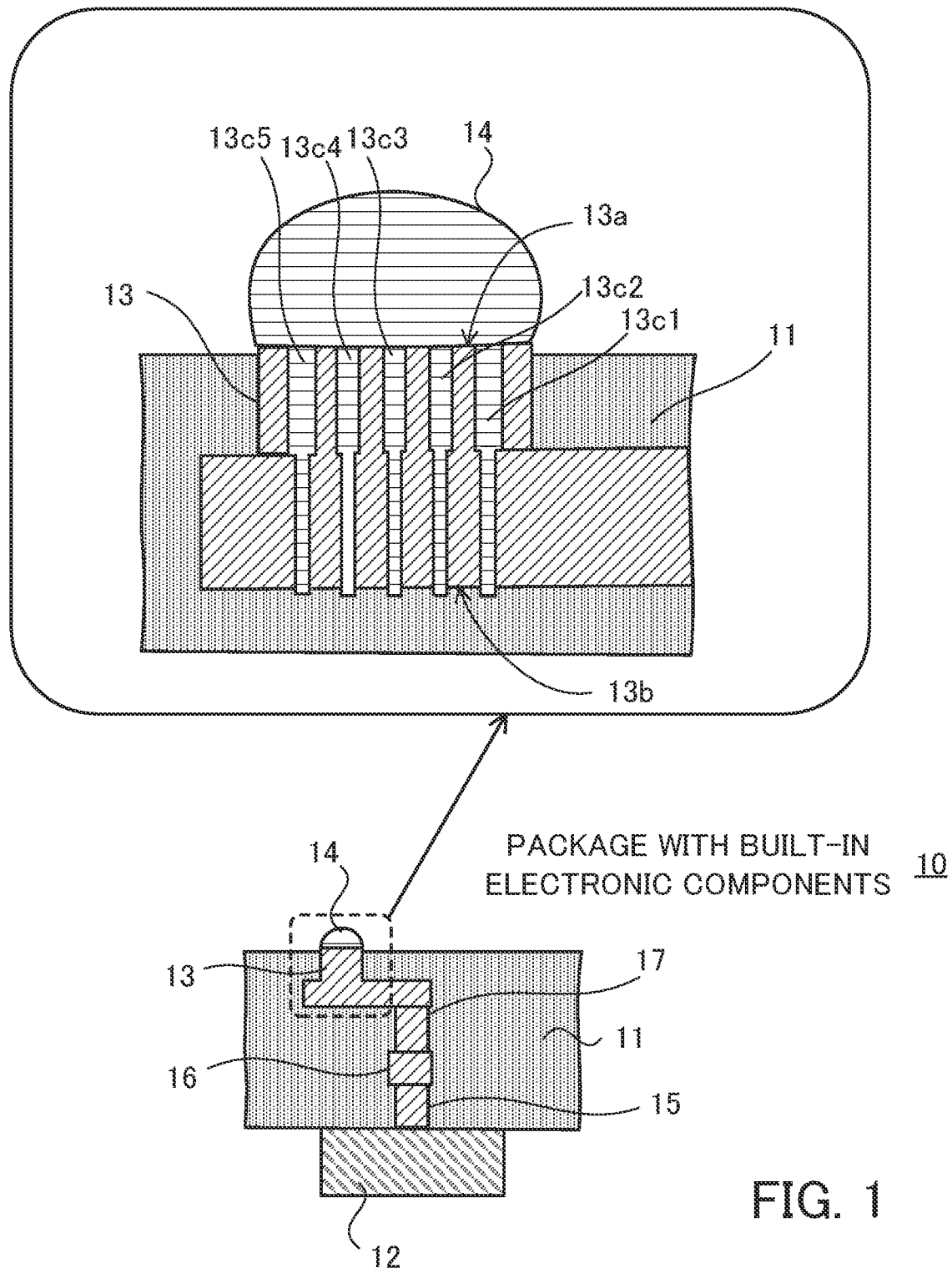
FIG. 1 is a cross-sectional view depicting part of a board with built-in electronic components according to a first embodiment.

FIG. 1 is a cross-sectional view depicting part of a board with built-in electronic components according to a first embodiment.

A package with built-in electronic components 10 according to the first embodiment is a package, such as an FOWLP or a CSP, that is to be joined by soldering to an electronic circuit board, such as a printed wiring board or a package board (also called a "module board").

The package with built-in electronic components 10 has an insulating layer 11, a pad 13 that is electrically connected to an electronic component 12 provided on one surface of the insulating layer, and a solder bump 14 disposed on the pad 13. In the example depicted in FIG. 1, the pad 13 is connected to a terminal (not illustrated) of the electronic component 12 via a contact plug 15, a land electrode 16, and a contact via 17.

Note that although one pad 13 that is electrically connected to one terminal (not illustrated) of the electronic component 12 is depicted in FIG. 1 to simplify the drawing, pads that are electrically connected to other terminals of the electronic component 12 are also provided in the same way as the pad 13.

As one example, when the package with built-in electronic components 10 is an FOWLP, the insulating layer 11 is an insulating film in the rewiring layer. When the package with built-in electronic components 10 is a CSP, the insulating layer 11 is an insulating film in an interposer.

As examples, the electronic component 12 is a large scale integrated circuit (LSI) chip or a memory chip. Although not depicted in FIG. 1, the electronic component 12 is embedded in a resin material, such as mold resin.

The pad 13 is also referred to as a "ball grid array (BGA) pad", and is an electrode pad on which a solder bump for soldering the package with built-in electronic components 10 to an electronic circuit board is disposed. The pad 13 may include an electrode called "under bump metal (UBM)". There are no particular limitations on the material that composes the pad 13, so long as the material can be electrically connected via the solder bump 14 to a printed wiring board. Single metals, such as copper (Cu), aluminum (Al), gold (Au), platinum (Pt), silver (Ag), nickel (Ni), titanium (Ti), tungsten (W), tantalum (Ta), tin (Sn), and chromium (Cr), and alloys of the same may be used as the material of the pad 13.

The pad 13 may have a single layer structure made of the metals or alloys mentioned above, or a multilayer structure. When a multilayer structure is used, to enhance the effect, described later, whereby peeling of the pad 13 is avoided by configuring the pad 13 in a certain way, it is preferable to use a material that strongly adheres to the insulating layer 11 of the pad 13 as the material of the part of the pad 13 (for example, the surface 13b) that contacts the insulating layer 11. Examples of suitable materials include Ti, W, Ta, Sn, and Cr, as well as alloys containing these metals. Note that in order to prevent an increase in connection resistance and broken connections, it is preferable to use a material aside from metal, which would be susceptible to interdiffusion with the solder bump 14, as the material for the part of the pad 13 (for example, the surface 13a) that contacts the solder bump 14.

As depicted in FIG. 1, the pad 13 is formed with openings 13c1, 13c2, 13c3, 13c4, and 13c5 that reach the insulating layer 11 from the surface 13a that contacts the solder bump. The openings 13c1 to 13c5 are formed so that the size (i.e., area) of the openings on the surface 13b side that contacts the insulating layer 11 is smaller than the size of the openings on the surface 13a side. By providing these openings 13c1 to 13c5, gas generated from the insulating layer 11 during soldering is vented through the openings 13c1 to 13c5 to outside of the package with built-in electronic components 10.

By forming the openings 13c1 to 13c5 so that the size of the openings on the surface 13b side is smaller than the size of the openings on the surface 13a side, it becomes possible to vigorously release gas and efficiently vent the gas compared to when the size of the openings on the surface 13b side is equal to or larger than the size of the openings on the surface 13a side.

The ratio of the size of the openings on the surface 13b side to the size of the openings on the surface 13a side is decided as appropriate so that the openings 13c1 to 13c5 do not become completely covered by solder during the soldering process. As one example, the openings 13c1 to 13c5 are fabricated so that the size of the openings on the surface 13b side is in a range of 0.5 to 0.9 times the size of the openings on the surface 13a side.

The openings 13c1 to 13c5 also have a function of reducing thermal stress generated by a difference in thermal expansion between the package with built-in electronic components 10 and an electronic circuit board.

In addition, as depicted in FIG. 1, the openings 13c1 to 13c5 are formed deeper than the surface of the insulating layer 11 (that is, the surface in contact with the surface 13b). As a result, gas generated from the insulating layer 11 is vented more efficiently.

Although the openings 13c1 to 13c5 have two different sizes in the depth direction in the example in FIG. 1, the openings 13c1 to 13c5 may have three or more different sizes. As one example, the openings 13c1 to 13c5 may have a tapered shape in the depth direction (see FIG. 25, described later). However, to improve the strength of attachment to the solder bump 14, it is preferable for the openings 13c1 to 13c5 to have a stepped structure in the depth direction as depicted in FIG. 1 in order to have larger surface areas.

Figure 2:
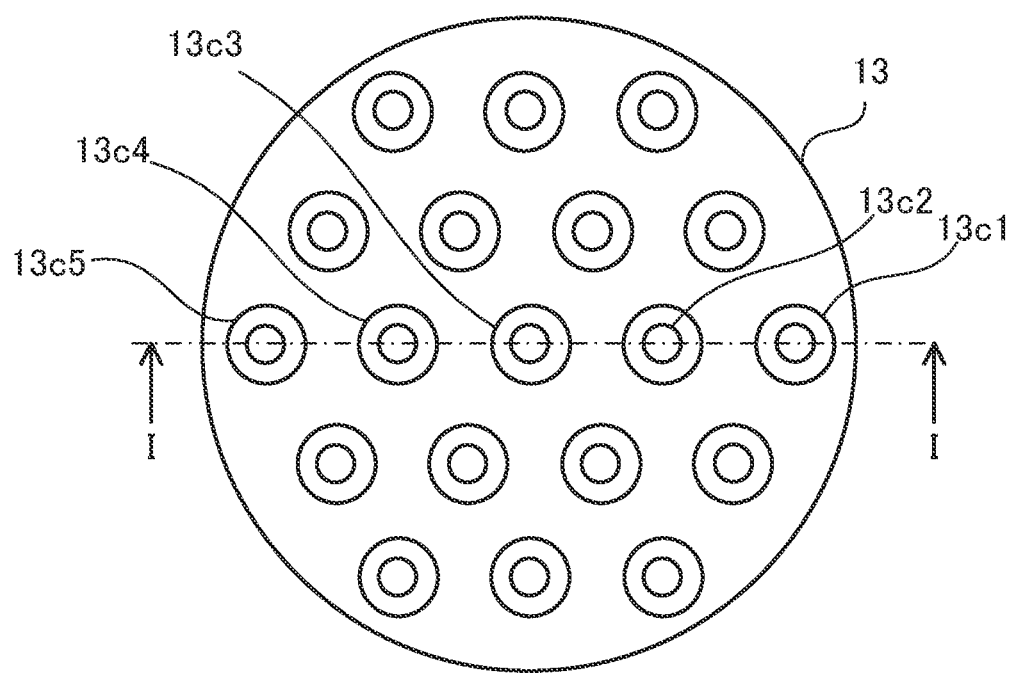
FIG. 2 is a plan view of a pad.

FIG. 2 is a plan view of a pad.

The pad 13 is formed with a plurality of openings, including the openings 13c1 to 13c5. A plurality of the pads 13 are provided on one side (that is, the surface opposite to the surface where the electronic component 12 is provided) of the insulating layer 11 of the package with built-in electronic components 10.

So long as the pad 13 is electrically connected via the solder bump 14 to the printed wiring board, there are no particular limitations on the shape of the pad 13 as viewed from above the surface 13a. However, since the thermal stress generated by the difference in coefficient of thermal expansion between the package with built-in electronic components 10 and the electronic circuit board (not illustrated) becomes uniform, it is preferable for the shape of the pad 13 as viewed from above the surface 13a to be circular as depicted in FIG. 2. When, for whatever reason, the shape of the pad 13 as viewed from above the surface 13a is made square, rectangular, or polygonal, it is preferable for the corners of the pad 13 to be rounded to avoid cracking and peeling of the pad 13 due to stress.

For the same reason, it is preferable for the shapes of the openings (that is, openings such as the openings 13c1 to 13c5) as viewed from above the surface 13a to be circular as depicted in FIG. 2. However, the shapes of the openings are not limited to this. The shapes of the openings as viewed from above the surface 13a may be composed of a single shape or a combination of shapes selected out of elliptical shapes, a square shape, rectangular shapes, polygonal shapes, and slit shapes. However, when the shapes of the openings as viewed from above the surface 13a are square, rectangular, or polygonal, it is preferable for the corners of the openings to be rounded to avoid cracking and peeling from the corners of the openings due to thermal stress.

In view of experimental results (see FIG. 23) described later, it is preferable for the ratio of the area occupied by the openings on the upper surface (that is, the surface 13b in FIG. 1) of the pad 13 to be at least 0.3% but no greater than 30%.

With the package with built-in electronic components 10 according to the first embodiment described above, gas generated from the insulating layer 11 during soldering is efficiently vented by the openings 13c1 to 13c5 that are formed with the shapes described above in the pad 13. This reduces the pressure applied onto the pad 13 by gas, which suppresses peeling of the pad 13 and makes the attachment of the pad 13 more reliable.

Second Embodiment

An example of manufacturing an FOWLP incorporating a plurality of electronic components as a package with built-in electronic components according to the second embodiment will now be described.

FIGS. 3 to 13 and 15 to 21 are cross-sectional views of respective processes in the manufacturing process of a package with built-in electronic components according to the second embodiment.

Figure 3:
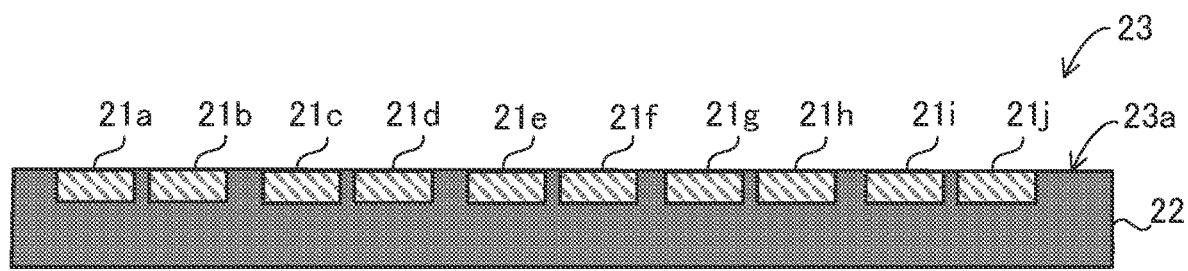
FIG. 3 is a first cross-sectional view of a process in a manufacturing process of a package with built-in electronic components according to a second embodiment.

First, a component-incorporating substrate 23, where electronic components 21a, 21b, 21c, 21d, 21e, 21f, 21g, 21h, 21i, and 21j are embedded in a mold resin 22, is fabricated (see FIG. 3). As examples, the electronic components 21a to 21j may be LSI chips or memory chips. Although not illustrated, one or a plurality of terminals of the respective electronic components 21a to 21j are exposed to a surface 23a of the component-incorporating substrate 23.

Figure 4:
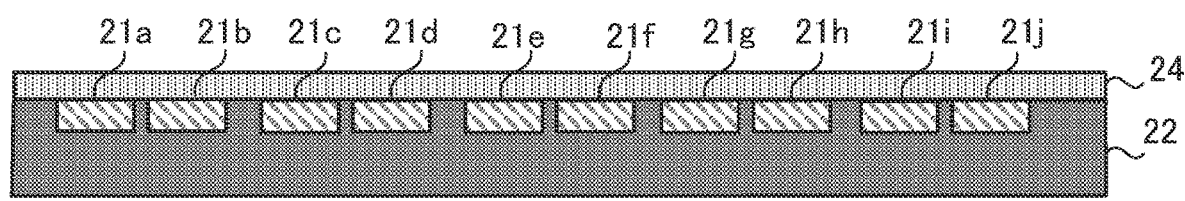
FIG. 4 is a second cross-sectional view of a process in the manufacturing process of the package with built-in electronic components according to the second embodiment.

Next, an insulating film 24 that is positively photosensitive is formed on the surface 23a of the component-incorporating substrate 23 (see FIG. 4). As examples, the insulating film 24 is a polyimide film or a phenol resin film. As one example, the insulating film 24 is formed by applying a resin material onto the surface 23a by spin coating and then prebaking. As example conditions, prebaking is performed at a temperature of 60° C. to 120° C. for 1 to 30 minutes.

Figure 5:
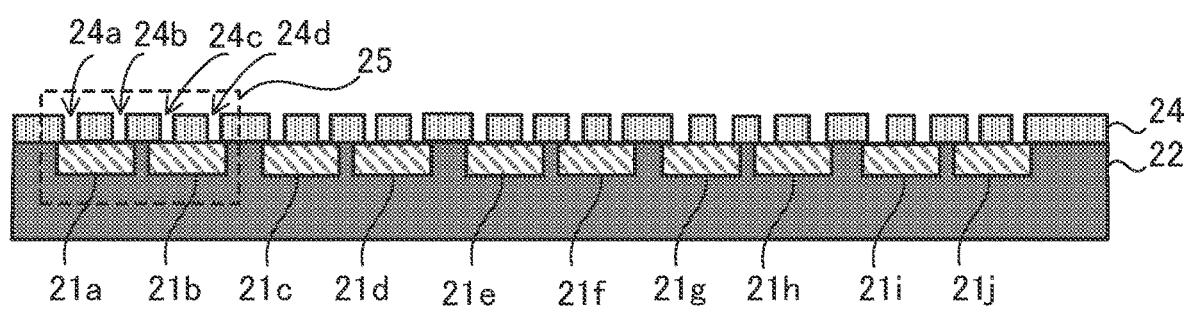
FIG. 5 is a third cross-sectional view of a process in the manufacturing process of the package with built-in electronic components according to the second embodiment.

After this, the insulating film 24 is exposed and developed to form a plurality of contact holes (such as contact holes 24a, 24b, 24c, and 24d) which pass through the insulating film 24 and expose the respective terminals of the electronic components 21a to 21j (see FIG. 5).

As one example, the plurality of contact holes are formed using a broadband 1× stepper. The diameter of each contact hole is 10 μm to 20 μm, for example. After the plurality of contact holes have been formed, as one example, curing is performed in a nitrogen atmosphere at 150° C. to 250° C. for 30 to 120 minutes.

The following description of the manufacturing process of a package with built-in electronic components focuses on one part, that is, the part numbered 25 in FIG. 5. Note that the same processes are performed on the other parts.

Figure 6:
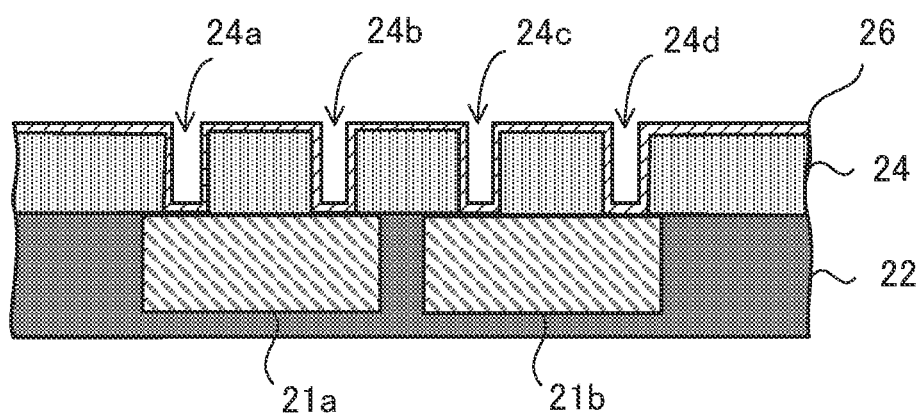
FIG. 6 is a fourth cross-sectional view of a process in the manufacturing process of the package with built-in electronic components according to the second embodiment.

After the process depicted in FIG. 5, a seed layer 26 is formed on the insulating film 24 in which the contact holes 24a to 24d have been formed (see FIG. 6). The seed layer 26 may be formed by sputtering, for example. As one example, the seed layer 26 is a multilayer film where a Ti layer and a Cu layer are laminated in that order. As examples, the thickness of the Ti layer is 30 to 200 nm, and the thickness of the Cu layer is 50 to 500 nm.

Figure 7:
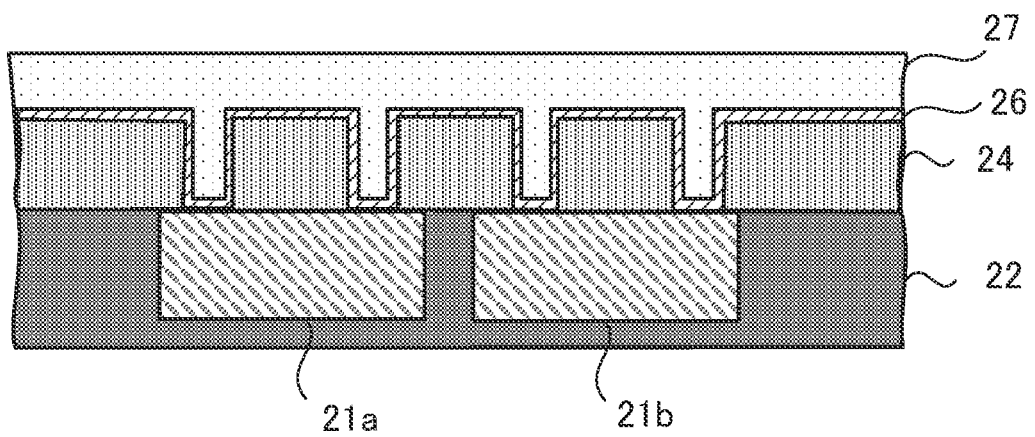
FIG. 7 is a fifth cross-sectional view of a process in the manufacturing process of the package with built-in electronic components according to the second embodiment.

Next, a positive resist film 27 is formed on the seed layer 26 (see FIG. 7). As one example, the resist film 27 is formed by applying material onto the seed layer 26 by spin coating and then prebaking. As example conditions, the prebaking is performed at a temperature of 60° C. to 120° C. for 1 to 30 minutes.

Figure 8:
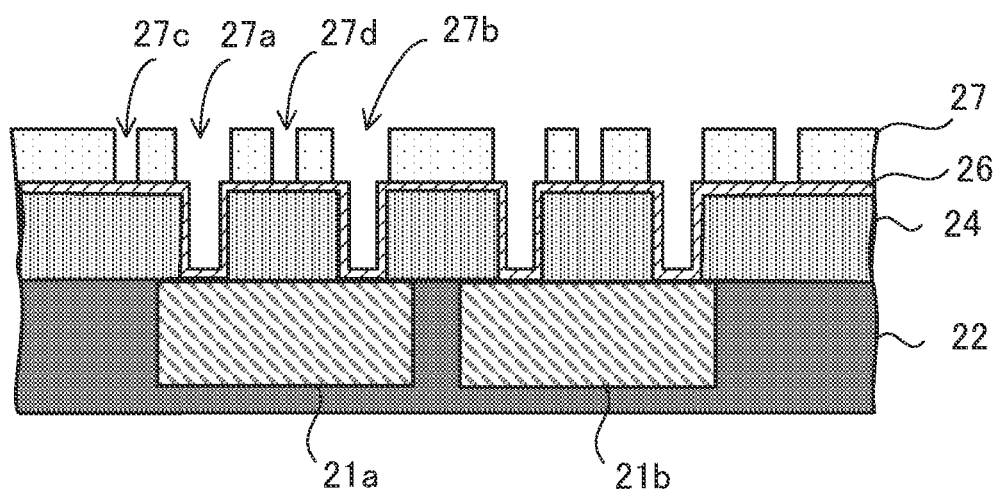
FIG. 8 is a sixth cross-sectional view of a process in the manufacturing process of the package with built-in electronic components according to the second embodiment.
Figure 9:
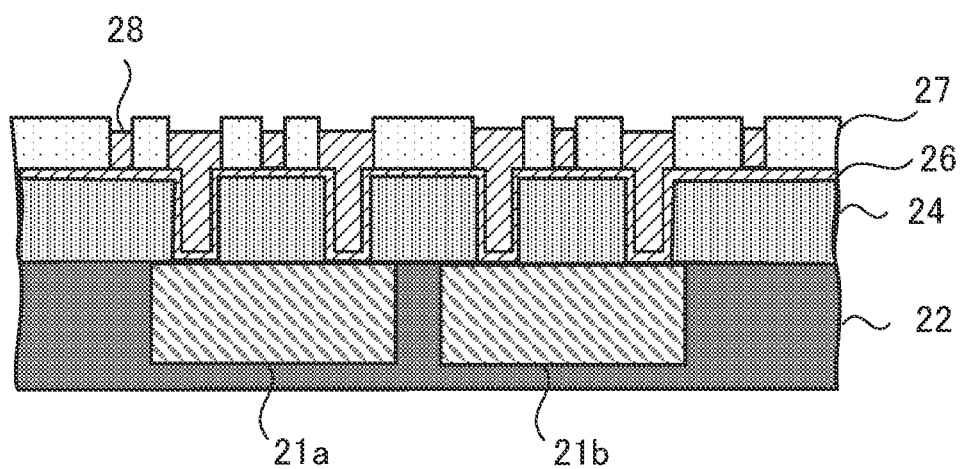
FIG. 9 is a seventh cross-sectional view of a process in the manufacturing process of the package with built-in electronic components according to the second embodiment.
Figure 10:
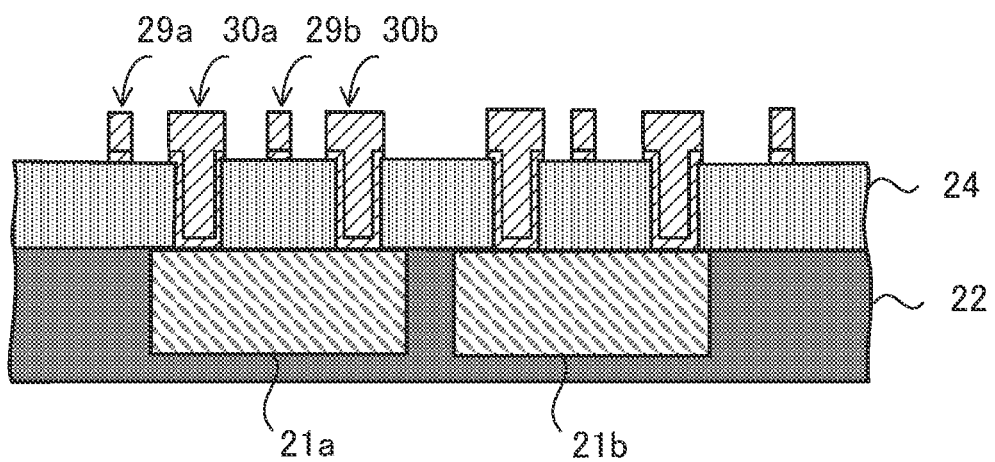
FIG. 10 is an eighth cross-sectional view of a process in the manufacturing process of the package with built-in electronic components according to the second embodiment.

After this, the resist film 27 is exposed and developed to form opening patterns (such as opening patterns 27a and 27b) for land electrodes and vias and opening patterns (such as opening patterns 27c and 27d) for wiring that both pass through the resist film 27 (see FIG. 8).

As one example, the opening patterns are formed using a broadband 1× stepper. The diameters of the opening patterns for land electrodes and contact plugs are 50 μm to 70 μm, for example. The width of the opening patterns for wiring are 5 μm to 15 μm, for example.

After this, the plating film 28 is formed by electroplating using the resist film 27, in which the opening patterns described above have been formed, as a mask (see FIG. 9). As one example, the plating film 28 is a Cu plating film. The thickness of the plating film 28 is 1 μm to 20 μm, for example.

After this, the resist film 27 is peeled off and the seed layer 26 is etched using the plating film 28 as a mask. As a result, wiring on a first layer (such as wiring 29a and 29b) and lands (such as lands 30a and 30b) that are integrally molded with contact plugs are formed (see FIG. 10).

After this, wiring on a second layer and the like is formed.

Figure 11:
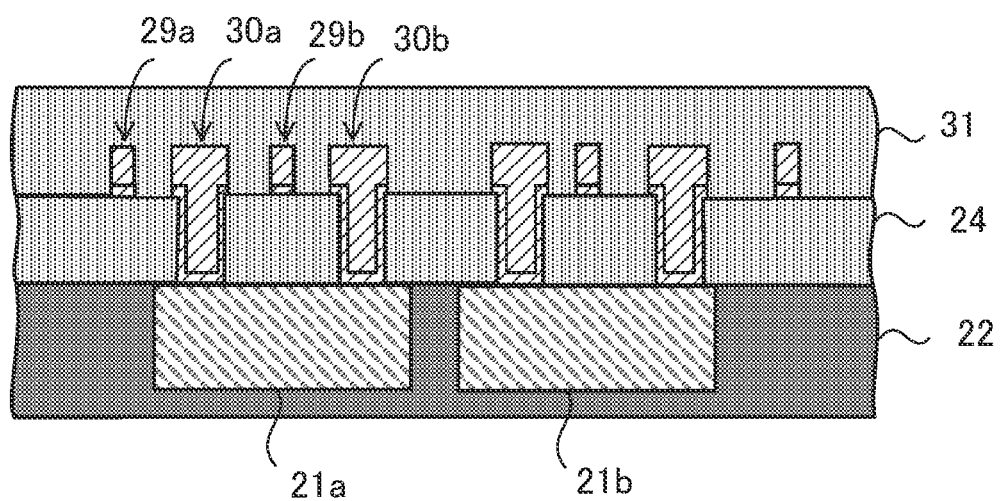
FIG. 11 is a ninth cross-sectional view of a process in the manufacturing process of the package with built-in electronic components according to the second embodiment.

First, an insulating film 31 that is positively photosensitive is formed on the substrate on which the wiring of the first layer and lands have been formed (see FIG. 11). As examples, the insulating film 31 is a polyimide film or a phenol resin film. As one example, the insulating film 31 is formed by spin coating and prebaking. As example conditions, the prebaking is performed at a temperature of 60° C. to 120° C. for 1 to 30 minutes.

Figure 12:
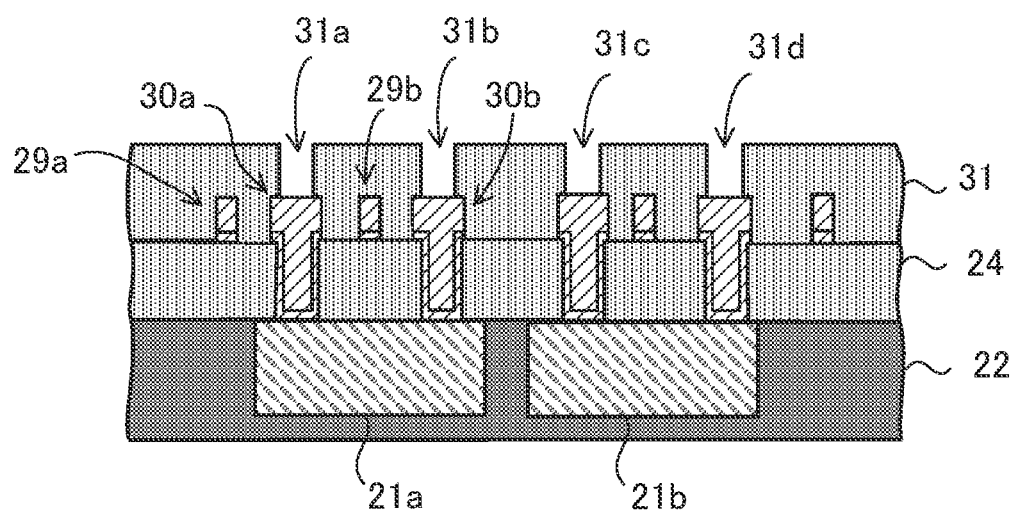
FIG. 12 is a tenth cross-sectional view of a process in the manufacturing process of the package with built-in electronic components according to the second embodiment.

Next, the insulating film 31 is exposed and developed to form a plurality of contact holes 31a, 31b, 31c, and 31d that pass through the insulating film 31 and expose lands (such as the lands 30a and 30b) (see FIG. 12).

As one example, the contact holes 31a to 31d are formed using a broadband 1× stepper. The diameter of the respective contact holes is 15 μm to 23 μm, for example. After the contact holes 31a to 31d have been formed, as one example, curing is performed in a nitrogen atmosphere at 150° C. to 250° C. for 30 to 120 minutes.

Figure 13:
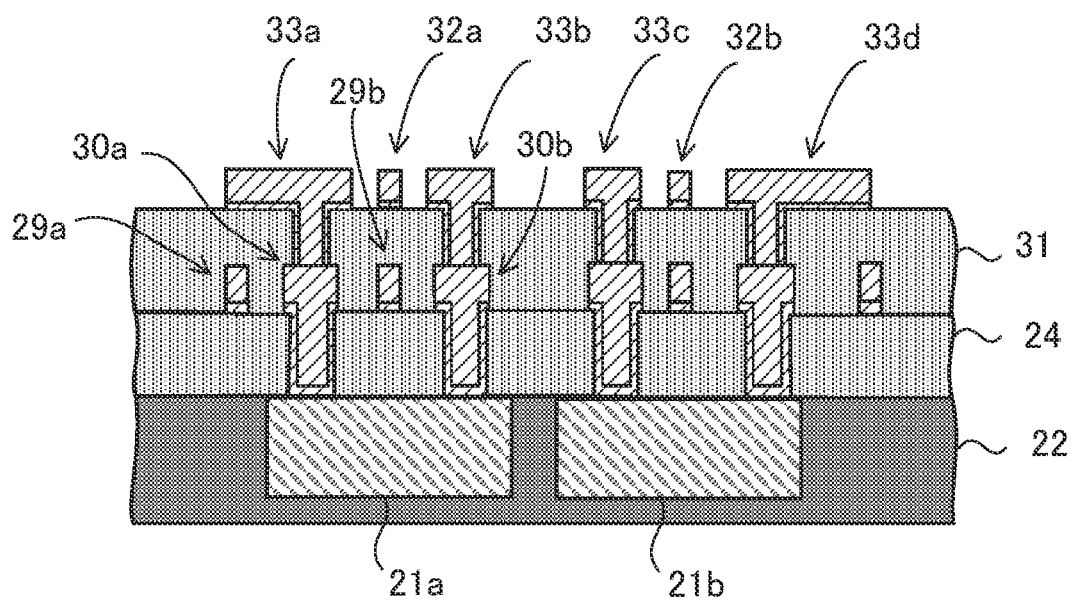
FIG. 13 is an eleventh cross-sectional view of a process in the manufacturing process of the package with built-in electronic components according to the second embodiment.

After this, by performing the same steps as in FIGS. 6 to 10, wiring 32a and 32b for the second layer and lands 33a, 33b, 33c and 33d that have been integrally molded with contact vias are formed (see FIG. 13). The lands 33a to 33d are electrically connected to lands on the first layer (such as the lands 30a and 30b).

Here, a plurality of through holes are formed by etching at least one of the lands 33a to 33d. In the following description, it is assumed that a plurality of through holes have been formed in the lands 33a and 33d. The lands 33a and 33d are parts of pads on which solder bumps are disposed.

Figure 14:
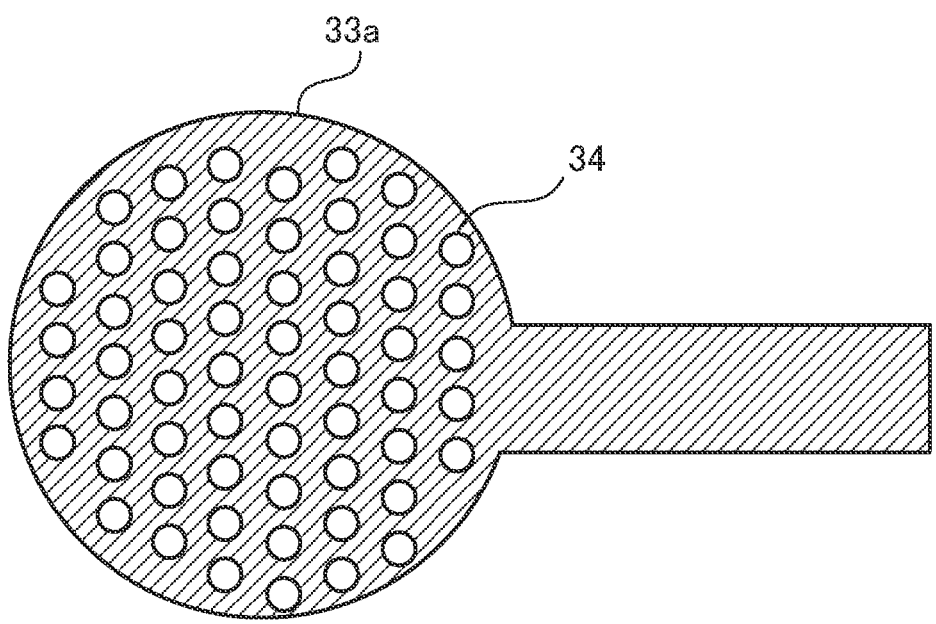
FIG. 14 is a plan view of an example land.

FIG. 14 is a plan view of an example land.

As one example, the land 33a is formed with a plurality of through holes (such as a through hole 34) as depicted in FIG. 14. The diameters of the respective through holes is 10 μm to 30 μm, for example.

Figure 15:
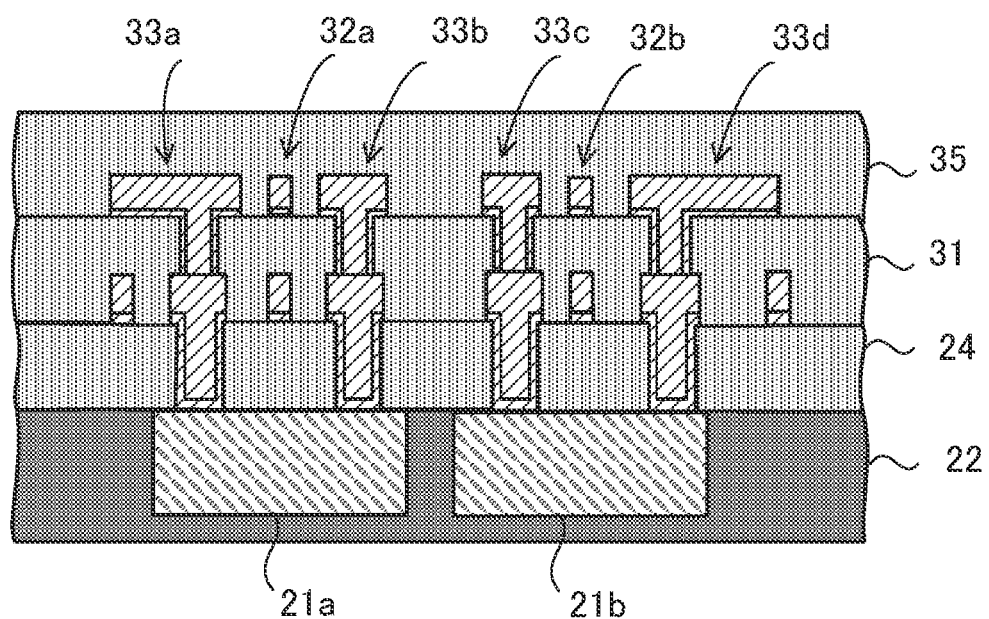
FIG. 15 is a twelfth cross-sectional view of a process in the manufacturing process of the package with built-in electronic components according to the second embodiment.

After the process depicted in FIG. 13, an insulating film 35 that is positively photosensitive is formed on the substrate on which the second layer wiring 32a and 32b and the lands 33a to 33d have been formed (see FIG. 15). The insulating film 35 is a polyimide film or a phenol resin film, for example. As one example, the insulating film 35 is formed by spin coating and prebaking. As example conditions, the prebaking is performed at a temperature of 60° C. to 120° C. for 1 to 30 minutes.

Note that the multilayer structure composed of the insulating films 24, 31, and 35 formed by the processes up to FIG. 15 corresponds to the insulating layer 11 depicted in FIG. 1.

Figure 16:
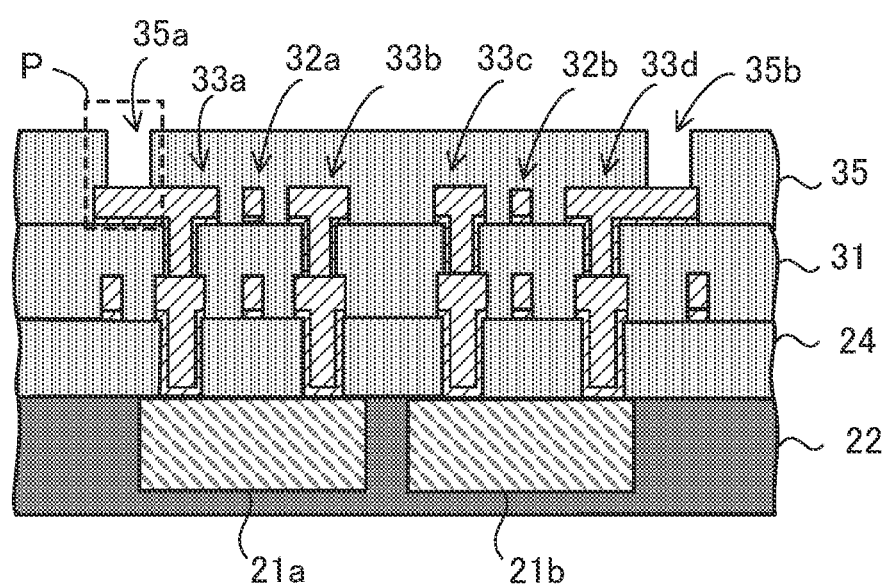
FIG. 16 is a thirteenth cross-sectional view of a process in the manufacturing process of the package with built-in electronic components according to the second embodiment.
Figure 17:
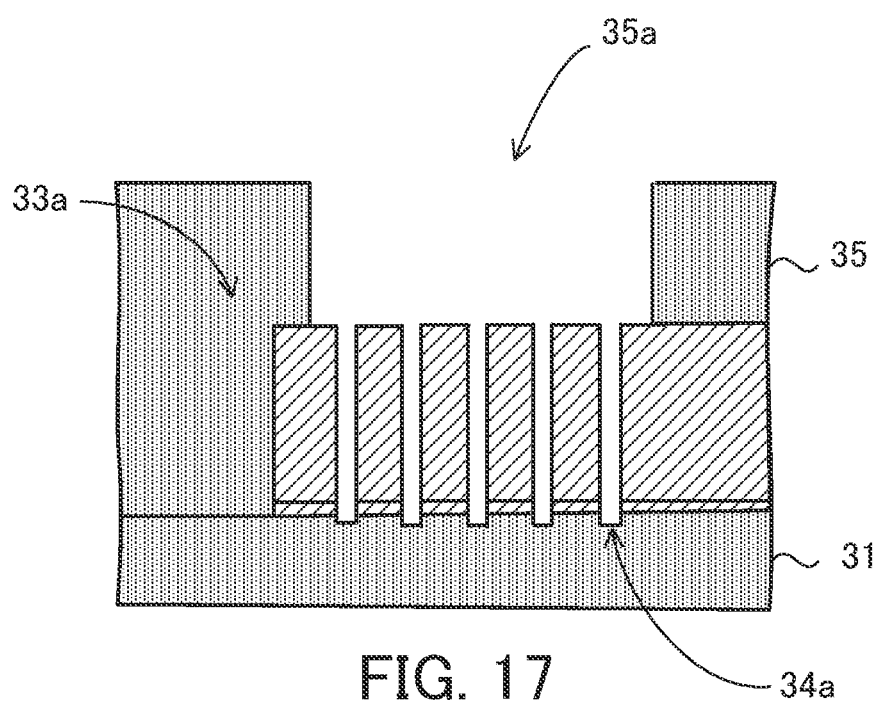
FIG. 17 is a fourteenth cross-sectional view of a process in the manufacturing process of the package with built-in electronic components according to the second embodiment.

Next, the insulating film 35 is exposed and developed to form opening patterns 35a and 35b that expose the parts of the lands 33a to 33d where a plurality of through holes have been formed in the lands 33a and 33d (see FIG. 16).

As one example, the opening patterns 35a and 35b are formed using a 1× broadband stepper. The opening patterns 35a and 35b have suitable shapes and sizes for the shapes and sizes of the pads to be formed. When the shape of a pad to be formed as viewed from above is circular, the diameters of the opening patterns 35a and 35b are 300 μm to 500 μm, for example. After the opening patterns 35a and 35b have been formed, as one example, curing is performed in a nitrogen atmosphere at 150° C. to 250° C. for 30 to 120 minutes.

The following description of the manufacturing process of a package with built-in electronic components (and in particular, the manufacturing process for pads) focuses on one part, that is, the part labelled "P" in FIG. 16. Note that the same processes are performed on the other parts.

After the step depicted in FIG. 16, the parts of the insulating film 35 that fill the plurality of through holes formed in the land 33a are removed by irradiation with oxygen plasma, for example, so as to form the plurality of through holes (for example, the through hole 34a) once again. Here, the plurality of through holes to be formed are formed deeper than the surface of the insulating film 31 (as one example, around 0.1 μm to 2 μm deeper) (see FIG. 17).

Figure 18:
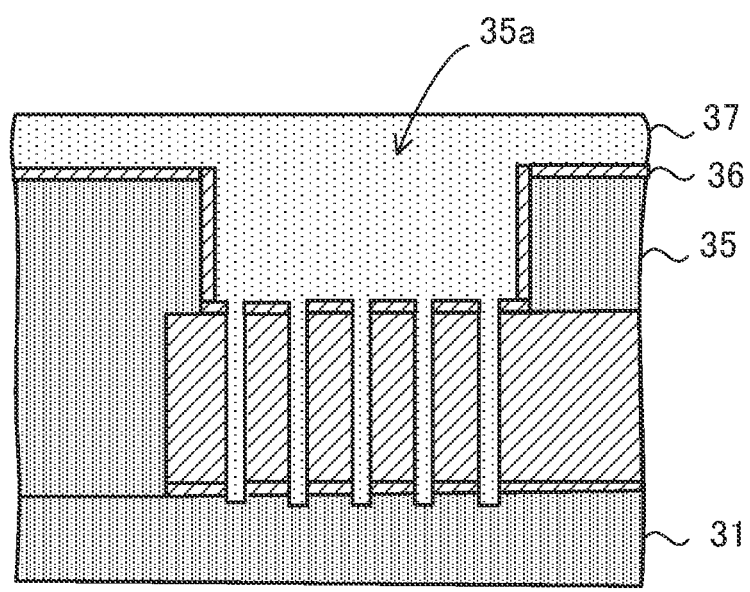
FIG. 18 is a fifteenth cross-sectional view of a process in the manufacturing process of the package with built-in electronic components according to the second embodiment.

Next, after the seed layer 36 described earlier has been formed on the insulating film 35 in which the opening pattern 35a is formed, a positive resist film 37 is formed on the seed layer 36 (see FIG. 18). As one example, the resist film 37 is formed on the seed layer 36 by spin coating and prebaking. As example conditions, the prebaking is performed at a temperature of 60° C. to 120° C. for 1 to 30 minutes.

Figure 19:
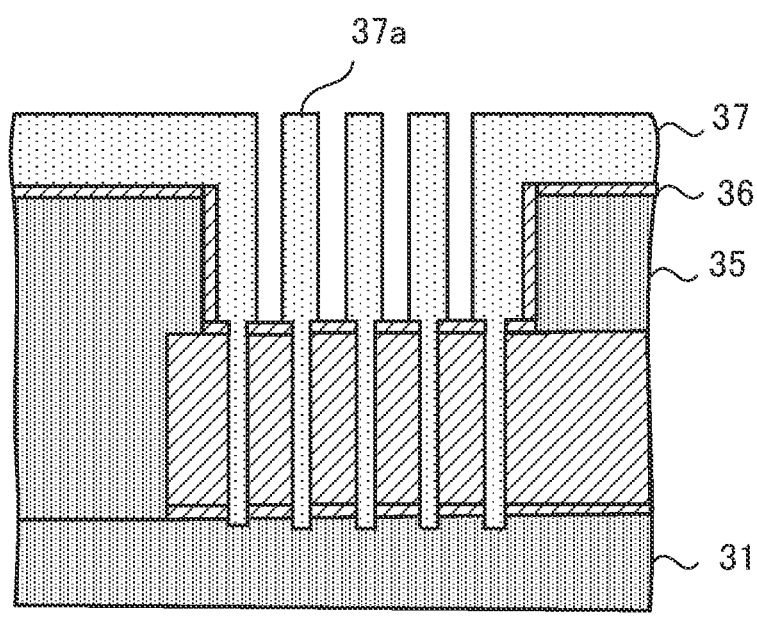
FIG. 19 is a sixteenth cross-sectional view of a process in the manufacturing process of the package with built-in electronic components according to the second embodiment.
Figure 20:
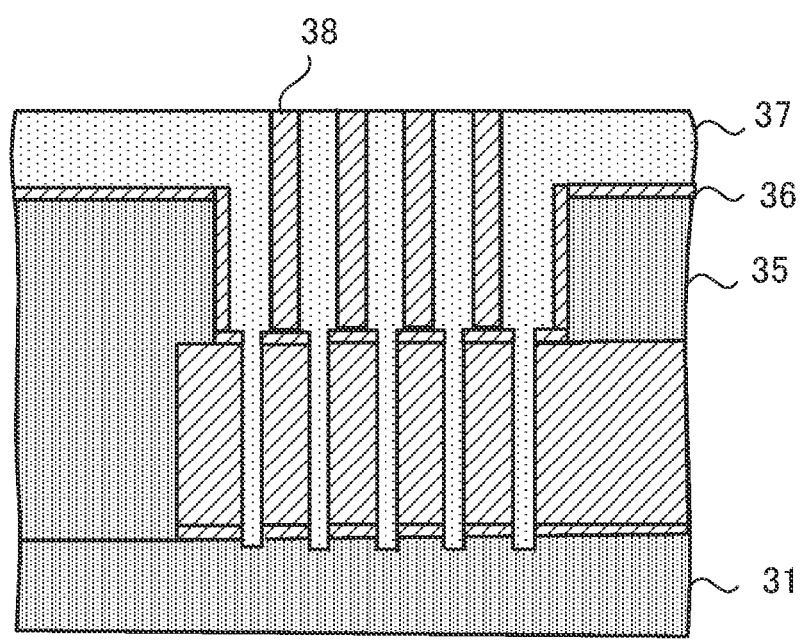
FIG. 20 is a seventeenth cross-sectional view of a process in the manufacturing process of the package with built-in electronic components according to the second embodiment.

After this, a resist pillar (for example, a resist pillar 37a) is formed on each through hole in the land 33a with a larger diameter than the through hole (see FIG. 19). As one example, the diameter of each resist pillar is, 1.1 to 2 times the diameter of the through hole.

As one example, the plurality of resist pillars are formed using a broadband 1× stepper.

The plating film 38 is then formed by electroplating using the plurality of resist pillars described above as a mask (see FIG. 20). As one example, the plating film 38 is a Cu plating film.

After this, the resist film 37 is peeled off and the seed layer 36 is etched using the plating film 38 as a mask. By doing so, a pad 39 including through holes with two different diameters in the depth direction is formed (see FIG. 21). These through holes correspond to one example of the openings 13c1 to 13c5 formed in the pad 13 depicted in FIG. 1.

After this, although not illustrated, a solder bump is formed on the pad 39 to complete the package with built-in electronic components according to the second embodiment. The package with built-in electronic components 10 according to the first embodiment depicted in FIG. 1 may also be manufactured by the same processes.

Note that although an example where a pad including through holes with two different diameters has been described above, it is also possible to form through holes with three or more different diameters. In that case, the processes in FIGS. 15 to 21 are repeated.

The package with built-in electronic components manufactured by the processes described above is soldered to an electronic circuit board, such as a printed wiring board or a package board.

Figure 22:
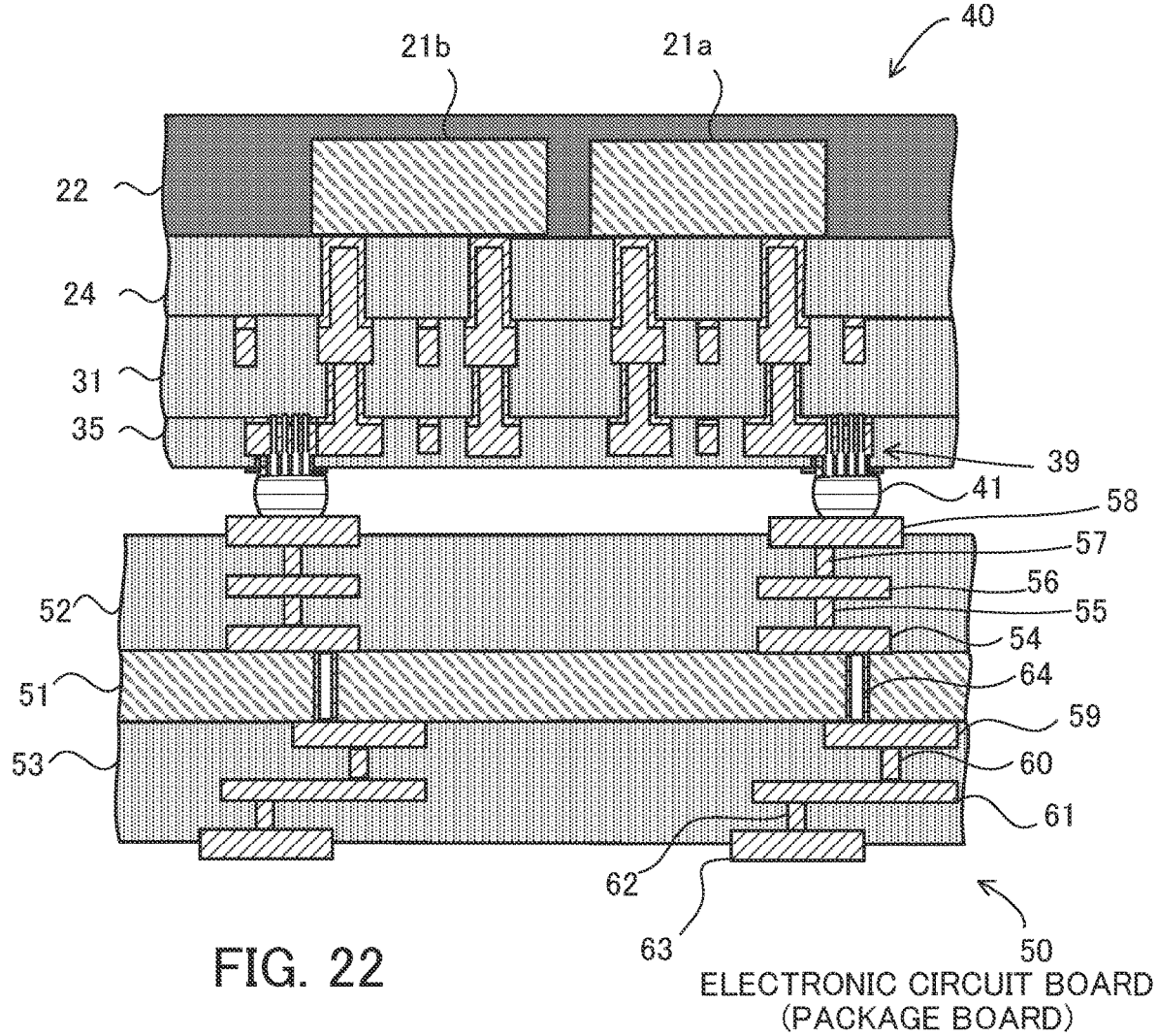
FIG. 22 is a cross-sectional view depicting part of an electronic device including a package with built-in electronic components and an electronic circuit board.

FIG. 22 is a cross-sectional view depicting part of an electronic device including a package with built-in electronic components and an electronic circuit board.

An electronic device 60 is manufactured by using a solder bump 41 formed on a pad 39 to solder a package with built-in electronic components 40 manufactured by the processes described above to, for example, an electronic circuit board 50 like that depicted in FIG. 22, which is one example of an electronic circuit board.

The electronic circuit board 50 has a core layer 51, an insulating layer 52 provided on the package with built-in electronic components 40-side surface of the core layer 51, and an insulating layer 53 provided on the opposite surface of the core layer 51 to the package with built-in electronic components 40 side.

A plurality of lands (as examples, lands 54 and 59), a plurality of vias (as examples, vias 55, 57, 60, and 62), and a plurality of wires (for example, wires 56 and 61) are formed in the insulating layers 52 and 53. A plurality of pads (as examples, pads 58 and 63) are also formed on the surfaces of the insulating layers 52 and 53.

A plurality of contact holes (for example, a contact hole 64) are formed in the core layer 51. In the example in FIG. 22, the lands 54 and 59 are electrically connected by the contact hole 64.

In the example in FIG. 22, the pad 58 of the electronic circuit board 50 is joined by the solder bump 41 to the pad 39 of the package with built-in electronic components 40.

According to the package with built-in electronic components 40, a plurality of openings (through holes) with two different diameters formed in a pad to be soldered (for example, the pad 39) are used to efficiently vent gas generated from an insulating layer (for example, the insulating film 31) during soldering. This reduces the pressure applied to the pad by the gas, which suppresses the peeling of the pad. This makes the attachment of the pad more reliable.

Figure 21:
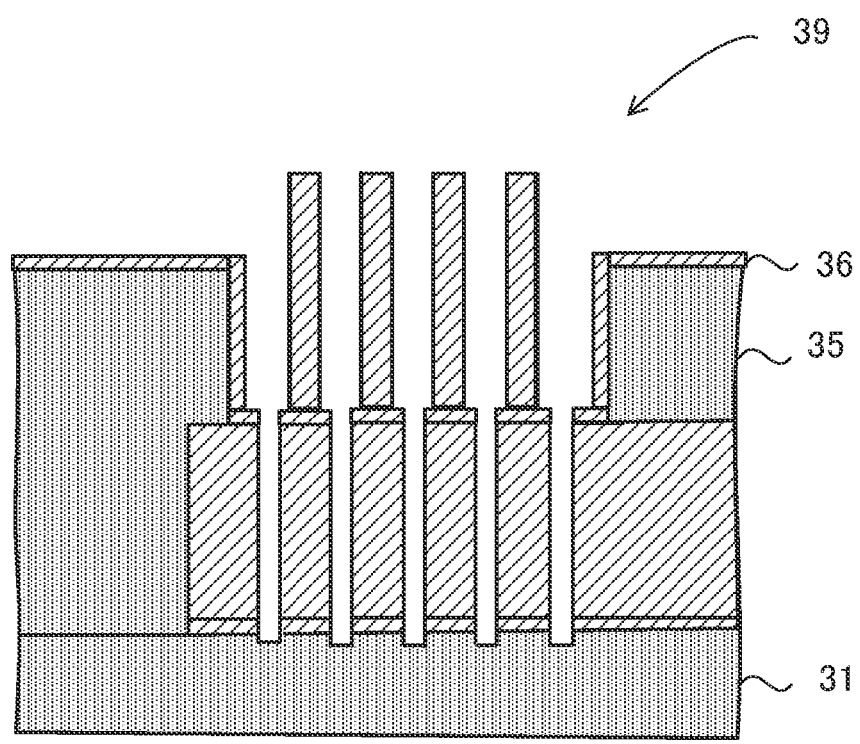
FIG. 21 is an eighteenth cross-sectional view of a process in the manufacturing process of the package with built-in electronic components according to the second embodiment.

Also, as depicted in FIG. 21, the through holes are formed deeper than the surface of the insulating film 31. By doing so, the venting of the gas generated from the insulating layer is made more efficient.

Note that since it is possible to suppress the peeling of pads as described above, this facilitates adoption of large-area packages that are greatly affected by thermal stress. This results in relaxed restrictions on the number of electronic components (for example, the number of chips) and the sizes of the electronic components (for example, the chip sizes) mounted in the package with built-in electronic components 40. It is expected that this will result in increased bandwidth when transmitting and receiving signals between electronic components, for example, the bandwidth of communication between a central processing unit (CPU) and memory, and reduced signal transmission losses.

Accordingly, the package with built-in electronic components 40 is also suited to modules such as a high-frequency module that uses a millimeter wave or terahertz wave band where low signal transmission loss is preferred.

Experimental Example

A thermal shock test was performed on an electronic device 60 where a package with built-in electronic components (or "FOWLP") 40 manufactured according to the processes described earlier has been soldered to an electronic circuit board 50.

Note that a plurality of samples were used where the through holes formed in the pad are circular, the diameter on the insulating layer side is 20 μm, and the ratio of the area occupied by the through holes on the pad surface (that is, the surface on the solder bump side) is in a range of 0.3% to 30%. Also, flame retardant type 4 (FR4) that was fabricated by a build-up method was used as the electronic circuit board 50.

As preprocessing for the thermal shock test, three cycles were performed of a process where each sample was dried at 125° C. for 24 hours, absorption of moisture was performed at 30° C. and 60% relative humidity for 192 hours, and then infrared reflow was performed at 260° C. for 1 minute.

In the thermal shock test, 100 cycles were performed of a process where each sample was cooled at −65° C. for 5 minutes and then heated at 150° C. for 5 minutes.

Note that thermal shock tests were also performed under the same conditions on a plurality of samples where the ratio of the area occupied by the through holes on the pad surface is in the ranges of 0% (that is, no through holes were provided) to 0.2% and 31% to 45% as comparative examples.

Figure 23:
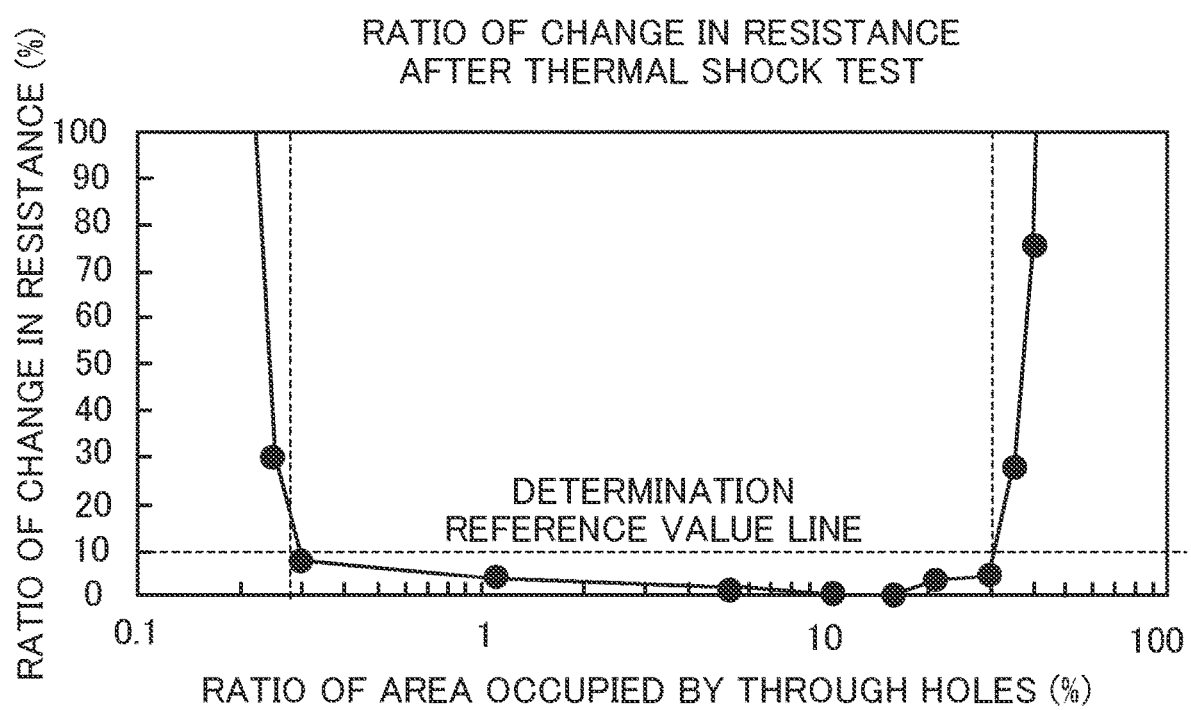
FIG. 23 depicts measurement results of a percentage change in resistance after a thermal shock test.

FIG. 23 depicts measurement results of the percentage change in resistance after the thermal shock test. The horizontal axis represents the ratio of the area occupied by the through holes, and the vertical axis represents the ratio of the change in resistance.

FIG. 23 indicates a line for a case where the determination reference value used to determine non-defective products is set at a percentage change in resistance of 10% or below. As depicted in FIG. 23, when the ratio of the area occupied by the through holes is 0.3% to 30%, the percentage change in resistance for all of the samples is 10% or below. In other words, it was found that there was little occurrence of current paths breaking due to the peeling of pads and the like.

It is believed that the percentage change in resistance increases sharply when the ratio of the occupied area is below 0.3% because little effect is achieved in easing stress and venting generated gas. As the reason why the percentage change in resistance increases sharply when the occupied area ratio is above 30%, it is believed that although there is an effect of easing stress and venting the generated gas, the area of attachment between the insulating layer and the pad is small, which greatly lowers the attachment strength.

Modifications

Figure 24:
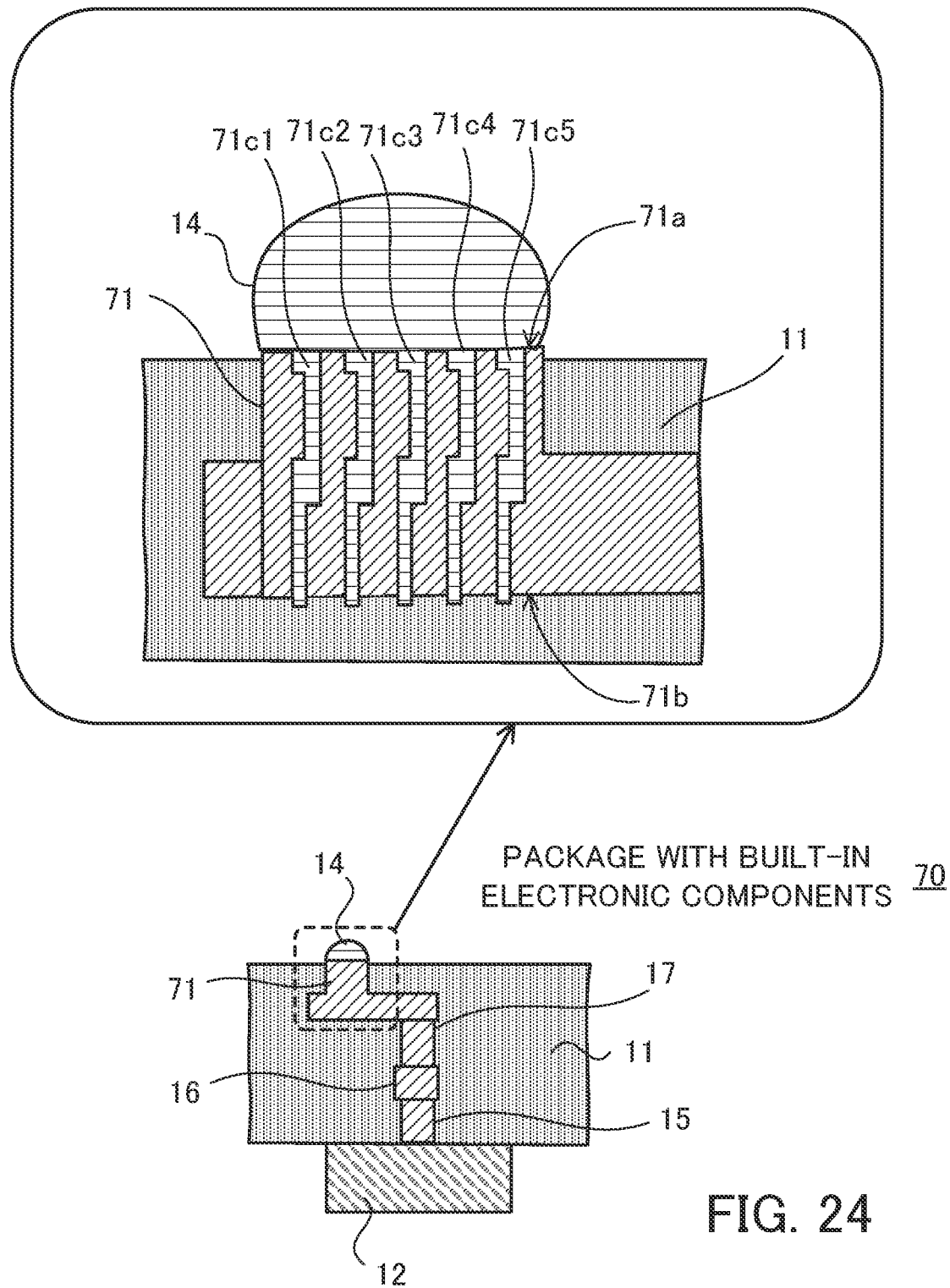
FIG. 24 is a cross-sectional view depicting a first modification of a package with built-in electronic components.

FIG. 24 is a cross-sectional view depicting a first modification of a package with built-in electronic components. In FIG. 24, elements that are the same as those depicted in FIG. 1 are designated by the same reference numerals.

A pad 71 of a package with built-in electronic components 70 as a first modification has openings 71c1, 71c2, 71c3, 71c4, and 71c5 for which the area of the opening on a surface 71b side is smaller than the area of the opening on a surface 71a side.

Unlike the openings 13c1 to 13c5 in the pad 13 in FIG. 1, the openings 71c1 to 71c5 have openings whose size (area) changes in a plurality of steps in the depth direction. As one example, when the size of the opening at the surface 71a side is regarded as a "first size" and the size at the surface 71b side is regarded as a "second size", as depicted in FIG. 24, the area of the opening changes in the depth direction so as to alternate between the first size and the second size.

By providing the openings 71c1 to 71c5, it is possible to achieve the effect of efficiently venting gas in the same way as with the openings 13c1 to 13c5 of the pad 13 in FIG. 1. Although the number of processing steps during manufacturing increases with the openings 71c1 to 71c5 compared to the openings 13c1 to 13c5 of the pad 13 in FIG. 1, since the surface area of the openings 71c1 to 71c5 increases, it is possible to improve the strength of attachment to the solder bumps 14.

FIG. 25 is a cross-sectional view depicting a second modification of a package with built-in electronic components. In FIG. 25, elements that are the same as those depicted in FIG. 1 are designated by the same reference numerals.

A pad 81 of a package with built-in electronic components 80 that is a second modification has openings 81c1, 81c2, 81c3, 81c4, and 81c5 where the size (area) of the opening on a surface 81b side is smaller than the size of the opening on a surface 81a side.

Unlike the openings 13c1 to 13c5 of the pad 13 in FIG. 1, the sizes of the openings 81c1 to 81c5 continuously decrease in the depth direction. In other words, the openings 81c1 to 81c5 are tapered.

When the openings 81c1 to 81c5 are formed with this shape, the effect of efficiently venting gas is still achieved, but the strength of attachment to the solder bump 14 will be inferior compared to the openings 13c1 to 13c5 of the pad 13 in FIG. 1.

Although the present embodiments have been described from the viewpoints of a package with built-in electronic components and an electronic device, the configurations described above are mere examples and the present embodiments are not limited to them.

According to one aspect, the present embodiment can improve the reliability of pad attachment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A package with built-in electronic components that is to be soldered to an electronic circuit board, comprising:
   an insulating layer;
   an electronic component provided on one surface of the insulating layer; and
   a pad which is electrically connected to the electronic component and in which a plurality of openings that extend from a first surface of the pad in contact with a solder bump to the insulating layer are formed, wherein an area of the plurality of openings at a second surface of the pad, which is an opposite surface to the first surface and is in contact with the insulating layer, is smaller than an area of the plurality of openings at the first surface.

2. The package with built-in electronic components according to claim 1, wherein the plurality of openings have a stepped structure in a depth direction.

3. The package with built-in electronic components according to claim 1, wherein the plurality of openings are formed deeper than a surface of the insulating layer that contacts the second surface.

4. The package with built-in electronic components according to claim 1, wherein a ratio of an area occupied by the plurality of openings on the first surface is at least 0.3% and no greater than 30%.

5. The package with built-in electronic components according to claim 1, wherein the plurality of openings are circular when viewed from above the first surface.

6. The package with built-in electronic components according to claim 1, wherein the plurality of openings have at least two different sizes in a depth direction.

7. An electronic device comprising:
   an electronic circuit board; and
   a package with built-in electronic components that is joined to the electronic circuit board by a solder bump and includes: an insulating layer; an electronic component provided on one surface of the insulating layer; and a pad which is electrically connected to the electronic component and in which a plurality of openings that extend from a first surface of the pad in contact with the solder bump to the insulating layer are formed, wherein an area of the plurality of openings at a second surface of the pad, which is an opposite surface to the first surface and is in contact with the insulating layer, is smaller than an area of the plurality of openings at the first surface.

* * * * *